United States Patent
Mitra et al.

(10) Patent No.: US 9,293,720 B2
(45) Date of Patent: Mar. 22, 2016

(54) CARBON NANOTUBES AS CHARGE CARRIERS IN ORGANIC AND HYBRID SOLAR CELLS

(75) Inventors: Somenath Mitra, Bridgewater, NJ (US); Cheng Li, Harrison, NJ (US)

(73) Assignee: New Jersey Institute of Technology, Newark, NJ (US)

(*) Notice: Subject to any disclaimer, the term of this patent is extended or adjusted under 35 U.S.C. 154(b) by 1063 days.

(21) Appl. No.: 12/033,040

(22) Filed: Feb. 19, 2008

(65) Prior Publication Data

US 2009/0205713 A1  Aug. 20, 2009

(51) Int. Cl.
  *H01L 31/00* (2006.01)
  *H01L 51/42* (2006.01)
  *B82Y 10/00* (2011.01)
  *H01L 51/00* (2006.01)

(52) U.S. Cl.
  CPC ............ *H01L 51/4253* (2013.01); *B82Y 10/00* (2013.01); *H01L 51/0036* (2013.01); *H01L 51/0046* (2013.01); *H01L 51/0048* (2013.01); *Y02E 10/549* (2013.01); *Y02P 70/521* (2015.11)

(58) Field of Classification Search
  USPC .......... 136/263, 256, 257; 977/735, 740, 745, 977/748, 751–753, 778, 784
  See application file for complete search history.

(56) References Cited

U.S. PATENT DOCUMENTS

| | | | |
|---|---|---|---|
| 6,580,027 B2 | 6/2003 | Forrest et al. | |
| 7,291,727 B1 | 11/2007 | Li et al. | |
| 7,718,888 B2 | 5/2010 | Cousins | |
| 2003/0140959 A1* | 7/2003 | Gaudiana et al. | 136/244 |
| 2005/0098204 A1* | 5/2005 | Roscheisen et al. | 136/263 |
| 2006/0011233 A1* | 1/2006 | Sariciftci et al. | 136/290 |
| 2006/0272701 A1* | 12/2006 | Ajayan et al. | 136/263 |
| 2007/0028958 A1 | 2/2007 | Retti | |
| 2007/0137701 A1* | 6/2007 | Sainte Catherine et al. | 136/263 |
| 2007/0289625 A1* | 12/2007 | Demadrille et al. | 136/263 |

FOREIGN PATENT DOCUMENTS

| | | | | |
|---|---|---|---|---|
| WO | WO 2004/112163 | * | 12/2004 | H01L 51/20 |
| WO | WO 2005/085130 | * | 9/2005 | C01B 31/00 |
| WO | WO 2007/130025 | * | 11/2007 | H01L 51/44 |

OTHER PUBLICATIONS

Li et al., "A fullerene-single wall carbon nanotube complex for polymer bulk heterojunction photovoltaic cells", J. Mater. Chem., Mar. 12, 2007, 17, 2406-2411.*

(Continued)

*Primary Examiner* — Thanh-Truc Trinh
(74) *Attorney, Agent, or Firm* — McCarter & English, LLP

(57) ABSTRACT

Organic and organic/inorganic hybrid bulk heterojunction photovoltaic devices with improved efficiencies are disclosed. The organic photovoltaic device comprises a photoactive polymer:fullerene $C_{60}$-carbon nanotube (polymer:$C_{60}$-CNT) composite as a component of the active layer. Under light irradiation, photoinduced charge separation at the polymer:$C_{60}$ interface is followed by electron transfer from $C_{60}$ onto CNTs for efficient electron transport towards an electrode. The organic/inorganic hybrid photovoltaic device comprises quantum dots and carbon nanotubes. Power conversion efficiency enhancement methods of polymer-CNT based photovoltaics are also provided.

17 Claims, 10 Drawing Sheets

(56) References Cited

OTHER PUBLICATIONS

Landi et al., "CdSe quantum dot-single wall carbon nanotube complexes for polymeric solar cells", Solar Energy Materials & Solar Cells, 87 (2005), pp. 733-746.*

Li et al., "C60 modified single-walled carbon nanotubes", Chemical Physics Letters, 377, 2003, pp. 32-36.*

Oh, et al., The Photovoltaic Effect of the p-n Heterojunction Organic Photovoltaic Device Using a Nano Template Method, Current Applied Physics 5, pp. 55-58, 2005.

Hoppe, et al., Organic Solar Cells: An Overview, J. Mater. Res., vol. 19, No. 7, pp. 1924-1945, Jul. 2004.

Wang, et al., Polymers Containing Fullerene or Carbon Nanotube Structures, Prog. Polym. Sci. 29, pp. 1079-1141, 2004.

Suemori, et al., Three-Layered Organic Solar Cells Incorporating a Nanostructure-Optimized Phthalocyanine: Fullerene Codeposited Interlayer; Applied Physics Letters, vol. 86, pp. 063509-1-063509-3, 2005.

http://www.popsci.com/popsci/flat/bown/2007/green/item_59.html, Green Tech Nanosolar Powersheet, The New Dawn of Solar, 3 pages.

Kamalakaran, et al., Microstructural Characterization of C-SiC-Carbon Nanotube Composite Flakes, Carbon 42, pp. 1-4, 2004.

Lewis, et al., Accelerated Imidization Reactions Using Microwave Radiation, Journal of Polymer Science: Part A: Polymer Chemistry, vol. 30, pp. 1647-1653, 1992.

Gedye, et al., The Use of Microwave Ovens for Rapid Organic Synthesis, Tetrahedron Letters, vol. 27, No. 3, pp. 279-282, 1986.

Giguere, et al., Application of Commercial Microwave Ovens to Organic Synthesis, Tetrahedron Letters, vol. 27, No. 41, pp. 4945-4948, 1986.

* cited by examiner (a)

(b)

CARBON NANOTUBES AS CHARGE CARRIERS IN ORGANIC AND HYBRID SOLAR CELLS

The present invention was made at least in part with funding received from the U.S. Army Research Office under grant DAAE30-03-D-1015. The U.S. Government may have certain right in this invention.

TECHNICAL FIELD

The present invention generally relates to organic and organic/inorganic hybrid photovoltaic devices, e.g., solar cells. More specifically, the invention is directed to the use of carbon nanotubes as electron transporters in organic and organic/inorganic hybrid photovoltaic devices.

BACKGROUND OF THE DISCLOSURE

Rising energy prices, the growing dependency on foreign oil, and environmental concerns have increased public and government interest in renewable sources of electricity generation. Photovoltaic devices, also known as solar cells, generate electrical power from ambient light. The solar power market has continuously grown in popularity and the ability to create high-efficiency solar cells is a key strategy to meeting growing world energy needs. Today's photovoltaic systems are predominantly based on the use of crystalline silicon, thin-film and concentrator photovoltaic technologies.

Crystalline silicon technologies can be differentiated into mono- or single-crystalline and poly- or multi-crystalline technologies. It has been estimated that crystalline silicon technologies represent almost 70 percent of the North American residential solar cell market. Mono-crystalline cells contain a uniform structure achieved by highly controlled manufacturing processes which require large amounts of the expensive silicon. Multi-crystalline cells contain small, individual crystals oriented in different directions. These cells use lesser amounts of the expensive silicon compared to mono-crystalline cells, but achieve lower efficiencies. Ribbon technologies, which incorporate a variation on the multi-crystalline production process, use fewer types of raw materials but also have lower energy conversion efficiency.

Thin-film technologies have lower efficiencies than crystalline silicon cells but permit direct application to a surface that can be either glass or plastic. Thin-film technology reduces end product costs because it allows for smaller amounts of semiconductor material to be used, can be manufactured by a continuous process, and results in a product that is less likely to be damaged during transportation. Thin-film technologies can also allow for applications on curved surfaces. Thin-film technologies have several drawbacks however. Amorphous silicon thin-film technologies use expensive silicon and have relatively low energy conversion efficiencies. The main drawback of cadmium telluride thin-film technologies is the toxicity of cadmium. The main disadvantages of copper indium diselenide and copper indium gallium diselenide technologies are the complexity involved in the manufacturing process, as defects easily form, and safety issues concerning the manufacturing process, which involves the extremely toxic gas hydrogen selenide.

Concentrator photovoltaic technologies provide high efficiencies through the use of concentrating optics which bundle arrays. Concentrator photovoltaics increase power output while reducing the number or size of cells needed. The main drawback to this technology is the requirement of expensive tracking systems. Concentrator photovoltaics can only use direct sunlight and therefore require a means to follow the movement of sunlight. Concentrator technologies are based on either crystalline silicon or gallium arsenide (GaAs). While silicon is very expensive, GaAs is fragile, a known carcinogen and is even more expensive than silicon.

As discussed above, current solar cell technologies have several drawbacks. Most existing technologies use expensive raw materials. Some traditional solar cells incorporate glass or plastics which makes the cells heavy, potentially dangerous, and expensive to ship. Some cells are expensive to install because they must be specially mounted or integrated with expensive tracking mechanisms. Other technologies use dangerous materials in the manufacturing process or final product. Also, up to 70% of the expensive silicon is wasted during some silicon solar cell manufacturing methods. Another drawback of some traditional silicon based photovoltaics is that they are rigid. While it is possible to incorporate these cells into fabric or other flexible material, the cells themselves remain solid. The electronics required for traditional cells adds further complexity to using them as anything other than standalone add-ons for devices or buildings. Lastly, existing silicon and other solar cell technologies may be reaching their limit in terms of cost to efficiency ratios.

Nanotechnology is currently enabling the production of organic photovoltaics (OPVs) to help meet the world energy demand and overcome the disadvantages associated with traditional silicon based photovoltaics. Organic photovoltaics are composed of layers of semiconducting organic materials (polymers or oligomers) that absorb photons from the solar spectrum. In OPVs, solar radiation promotes the photoactive semiconducting organic materials in the photoactive layer to an excited state. This excited state is referred to as an exciton and is a loosely bounded electron-hole pairing.

Organic photovoltaics aim to achieve moderate power conversion efficiencies at a low cost. The main drawback to OPVs is that they are much less efficient at converting light into electricity as compared to silicon based devices. However, OPVs are much less expensive than their silicon based counterparts. In addition, OPVs based on conjugated polymers can be fabricated by highly scaleable, high speed coating and printing processes, such as spin coating and ink-jet printing, to cover large areas on flexible substrates, enabling rapid mass-production. OPVs' low cost and manufacturing ease make them attractive even if their efficiencies are lower than that of existing technologies.

As a result, OPVs have emerged in recent years as promising alternatives to silicon based solar cells and a great deal of effort is being devoted, in both academic and industrial laboratories, to increase in power conversion efficiency and scale-up of the production processes. As previously mentioned, an attractive feature of OPVs based on conjugated polymers is that they can be fabricated by a coating process (e.g., spin coating or inkjet printing) to cover large areas on flexible substrates. The ability of OPVs to be fabricated by a coating process covering large flexible substrates was made possible by the discovery of photoinduced electron transfer from the excited state of a conjugated polymer (as the donor) onto fullerene (as the acceptor). Fullerene provides higher electron separation and collection efficiency compared to previously known electron acceptors.

Photovoltaic cells based on polymer/fullerene $C_{60}$ planar heterojunctions have been previously reported. Blending a conjugated polymer and $C_{60}$ (or its functionalized derivatives) results in moderate charge separation and collection efficiencies due to the formation of bulk donor-acceptor (D-A) heterojunctions. Much effort has gone into finding the best combination of D-A pairs and the optimum fabrication process.

The key to OPV technology is the mechanism of effective separation and transport of charge carriers, in absence of which energy is wasted. Energy conversion efficiency of OPVs has been approaching 5% under one sun irradiation using a conjugated polymer poly(3-hexyl-thiophene) (P3HT) as the electron donor and a fullerene derivative (6,6)-phenyl-$C_{61}$-butyric acid methyl ester (PCBM) as the electron acceptor. To achieve high performance, usually 50 wt % or more PCBM is required in the blend to create large numbers of exciton dissociation sites and to form an extensive percolation network for electron transport. PCBM is effective in bulk heterojunction solar cells because of its high solubility in organic solvents, such as toluene, and has better electron mobility as compared to $C_{60}$. $C_{60}$ on the other hand, is a stronger electron acceptor than PCBM and is more efficient in charge separation. In addition, PCBM is intrinsically more expensive than $C_{60}$ because it involves the derivatization of $C_{60}$ by complicated synthesis routes. The derivatization increases the overall cost of photovoltaic devices using PCBM as the electron acceptor.

Quantum Dots can be added to OPVs to form organic/inorganic hybrid photovoltaics. Quantum dots (QDs) are inorganic semiconductor crystals with a typical size of several nanometers. QDs possess properties that make them attractive for the development of high-efficiency, low-cost photovoltaics. For example, QDs can serve as electron acceptors when formed as a composite with a semiconducting polymer(s). Also, as compared to other electron acceptors (such as $C_{60}$ in organic blend devices and $TiO_2$ in dye-sensitized devices), QDs can absorb a large part of the solar spectrum and produce electron-hole pairs (excitons) that can be later dissociated and contribute to photogenerated current. However, inefficient transport of photogenerated charge carriers, like in OPVs, is a major source of efficiency loss in QD-polymer based photovoltaic devices.

Carbon nanotubes (CNTs), especially single wall carbon nanotubes (SWCNTs), are known as excellent electron transporters. Applications of CNTs in OPVs have been of much interest SWCNTs have in fact been employed as electrodes and blended with conjugated polymers to form bulk heterojunctions in the active layers. Kymakis et al. first reported a photovoltaic device based on the blend of SWCNTs and the conjugated polymer poly(3-octylthiophene) (P3OT). Adding SWCNTs to the P3OT matrix improved the photocurrent by more than two orders of magnitude. In a recent work, Pradhan et al. blended functionalized multi-walled carbon nanotubes (MWCNTs) into a P3HT polymer to provide extra dissociation sites and assist in charge transport in a P3HT-MWCNT/$C_{60}$ double-layered device.

The major advantage of CNTs lies in their superior electron transport properties. However, nanotubes distributed within a polymer matrix are less efficient in separating photogenerated carriers than spherical $C_{60}$ molecules that have a larger surface to volume ratio and it is difficult to disperse CNTs in a photoactive matrix. Purified CNTs blended with a polymer matrix have been found to be metastable and uniform distribution in a polymer matrix has been elusive.

SUMMARY AND DISCLOSURE

The present disclosure provides organic and broad-band inorganic/organic hybrid photovoltaic devices with moderate power conversion efficiency. The OPV devices generally include a polymer:$C_{60}$-carbon nanotube (polymer:$C_{60}$-CNT) complex. The broad-band inorganic/organic hybrid photovoltaic (HPV) devices typically include a polymer-QD:$C_{60}$-carbon nanotube (polymer-QD:$C_{60}$-CNT) complex or a polymer-QD:carbon nanotube (polymer-QD:CNT) complex. Advantageously, these photovoltaic devices utilize the electron donating functionality of a polymer, the electron accepting feature of $C_{60}$ and/or QDs, and the high electron transport capability of CNTs.

The present disclosure also provides for methods for enhancing the efficiency of organic and inorganic/organic hybrid photovoltaic devices. In an exemplary embodiment, the present disclosure provides photovoltaic devices with enhanced power conversion efficiency by improved optical absorption and appropriate morphological rearrangement.

In an exemplary embodiment, the present disclosure provides photovoltaic devices with an improved open-circuit voltage ("$V_{OC}$"), short circuit current density ("$J_{SC}$") and fill factor ("FF").

Additional features, benefits and functions associated with the present disclosure will be apparent from the description of exemplary embodiments which follows, particularly when read in conjunction with the accompanying figures.

BRIEF DESCRIPTION OF THE DRAWINGS

The foregoing and other features of the present disclosure will be more readily apparent from the following detailed description of exemplary embodiments taken in conjunction with the attached drawings, in which.

DESCRIPTION OF EXEMPLARY EMBODIMENTS

The following describes certain exemplary embodiments of the present disclosure. It should be understood that the following is intended merely to be exemplary of the disclosure.

Figure 1:
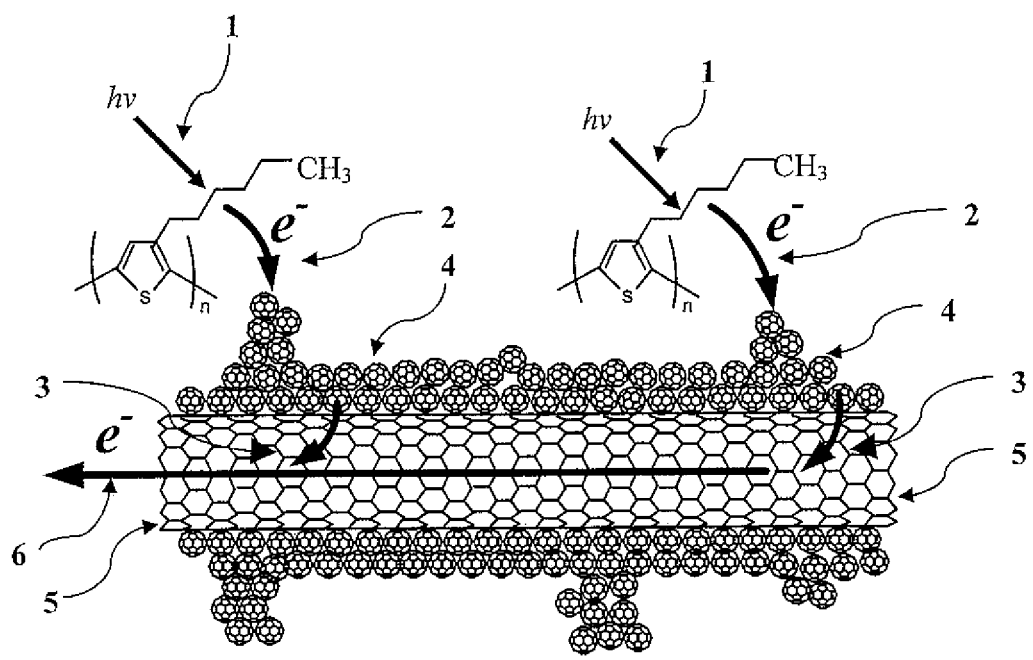
FIG. 1 is a schematic representation of an exemplary P3HT:$C_{60}$-SWCNT composite.

The present disclosure provides cost effective organic photovoltaic devices with increased power conversion efficiencies over previously demonstrated OPVs. The present disclosure provides polymer:fullerene $C_{60}$-carbon nanotube (polymer:$C_{60}$-CNT) composites adapted and/or developed for organic photovoltaic cells. The disclosed composite generally includes a polymer as the electron donor, $C_{60}$ as the electron acceptor and CNTs as a means of electron transport. As FIG. 1 illustrates, under light irradiation 1, photoinduced charge separation at the polymer/$C_{60}$ interface 2 is followed by electron transfer 3 from $C_{60}$ 4 onto bonded CNTs 5. The CNT network provides a direct path for faster electron transport towards the electrode 6.

In exemplary embodiments, $C_{60}$ is employed because $C_{60}$ is a stronger electron acceptor, is more efficient in charge separation and is significantly less expensive than PCBM. In exemplary embodiments and methods to follow, SWCNTs are advantageously employed to form the CNT network. Any suitable carbon nanotubes may be used, however, such as multi-walled carbon nanotubes (MWCNTs).

In exemplary embodiments and methods to follow, the conjugated polymer poly(3-hexyl-thiophene) (P3HT) is desirably employed as the polymer and electron donor because of its high hole mobility, high air stability and in consideration of the inexpensive nature of the entire composite. However, any suitable photoactive polymers, liquid crystal polymers, semi-conducting polymers, conducting polymers or other materials may be employed as the electron donor. Suitable photoactive polymers include, but are not limited to, poly(3-allkylthiophenes) (P3ATs), such as poly(3-hexylthiophene), poly(3-octylthiophene) and poly(3-dodecylthiophene), and poly(p-phenylenevinylenes) (PPVs), such as polys(2-methoxy-5-(2-ethylhexyloxy)-1,4-phenylenevinylene) and poly[2-methoxy-5-(3,7-dimethyloctyloxy)-p-phenylene vinylene]. Suitable semi-conducting polymers include, but are not limited to, polyaniline and polyfluorenes, such as (9,9-dioctylfluorene-co-N-(4-butylphenyl). Other suitable materials that may used include, but are not limited to, phthalocyanines (such as CuPc, ZnPc), porphyrins and liquid crystals.

Exemplary methods according to the present disclosure provide techniques for fabricating a polymer:$C_{60}$-CNT composite and fabricating bulk heterojunction OPVs that include a polymer:$C_{60}$-CNT composite. The disclosed methods also provide techniques for enhancing the efficiency of polymer:$C_{60}$-CNT based OPVs via solvent vapor and thermal annealing. The methods of the present disclosure also provide techniques for efficiency enhancement of polymer:$C_{60}$-CNT based OPVs that include alignment of CNTs in an electrical field and the addition of at least one dye or titanium dioxide.

An exemplary implementation of the disclosed fabrication method for forming a polymer:$C_{60}$-CNT composite will now be described. Soluble SWCNTs can be synthesized by a one-step microwave reaction, where both carboxylated (—COOS) and sulfonated (—$SO_2OH$ or —$SO_3$) groups are present, making the constituents highly soluble in water and polar solvents, such as alcohols (e.g., methanol, ethanol, acetone). The same procedure can be used to prepare water or ethanol-soluble SWCNTs. The photoactive polymer composite containing the $C_{60}$-SWCNT complex may then be prepared by first preparing a bulk solution of $C_{60}$ in toluene. Then, the SWCNT aqueous solution or the SWCNT ethanol solution and the $C_{60}$ solution can be mixed, sonicated and microwave irradiated. P3HT can then be thoroughly stirred into the processed solution so as to produce a P3HT:$C_{60}$-SWCNT composite.

The following specific but non-limiting example of an implementation of the disclosed fabrication method for forming a P3HT:$C_{60}$-SWCNT composite is presented for illustration thereof. First, soluble SWCNTs were synthesized as follows: a specific amount of HiPCO SWCNTs were weighed and added to a 1:1 mixture of sulfuric acid and nitric acid followed by a 10 minute microwave irradiation at 450 W in a microwave reactor under pressure control mode. After diluting with deionized water and filtering through a PTFE filter membrane, residues left on the filter membrane were washed with deionized water, dried in an oven and weighed in order to calculate the amount of SWCNTs in the filtrate. Acid in the filtrate was gradually removed by exchange with deionized water through a dialysis process until the pH value of the filtrate reached neutral. The SWCNT solution was heated at 105° C. until the desired concentration was achieved (typically 1 mg ml$^{-1}$). SWCNT ethanol solution (0.5 mg ml$^{-1}$) was obtained by drying the water-soluble SWCNTs and then adding the desired volume of ethanol.

Next, the photoactive polymer composite containing the $C_{60}$-SWCNT complex was prepared as follows: fullerene powder (99.98% purity), regioregular P3HT and toluene were obtained. A bulk solution of $C_{60}$ in toluene was prepared at a concentration of 3 mg ml$^{-1}$. At that time, 1 ml of the SWCNT aqueous solution or 1 ml of the SWCNT ethanol solution was mixed with 25 ml of the $C_{60}$ solution. The mixtures were sonicated for 1 hour followed by microwave irradiation at 800 W for 15 minutes. Finally, P3HT was added to the processed solutions to achieve a weight percentage of 70 and the composites were stirred overnight at room temperature. In the final mixtures, the concentration of SWCNTs was around 0.4%.

For comparison, a P3HT:$C_{60}$ composite at a 7:3 weight ratio was also prepared by directly dissolving P3HT and $C_{60}$ in toluene. Scanning electron microscopy (SEM) images were taken using a field-emission scanning electron microscope on films deposited on cleaned silicon wafers from a toluene solution of the $C_{60}$-SWCNT complex. Fourier transform infrared (FTIR) spectra were measured using a FTIR spectrometer by taking a few drops of toluene solutions of $C_{60}$ or the $C_{60}$-SWCNT complex on KBr pellets.

Figure 2:
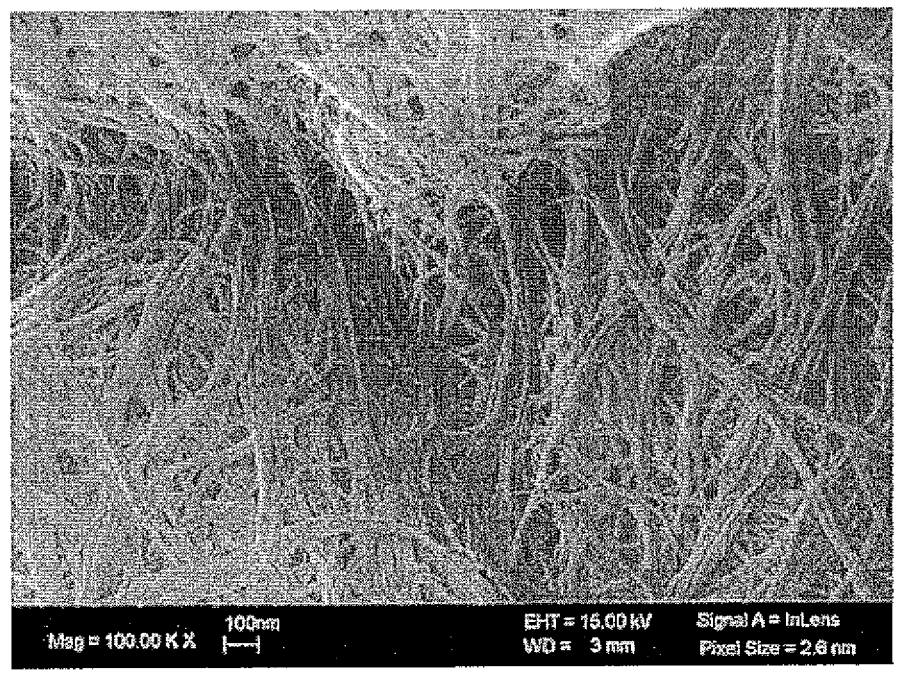
FIG. 2 shows a scanning electron microscope image of SWCNTs.
Figure 3:
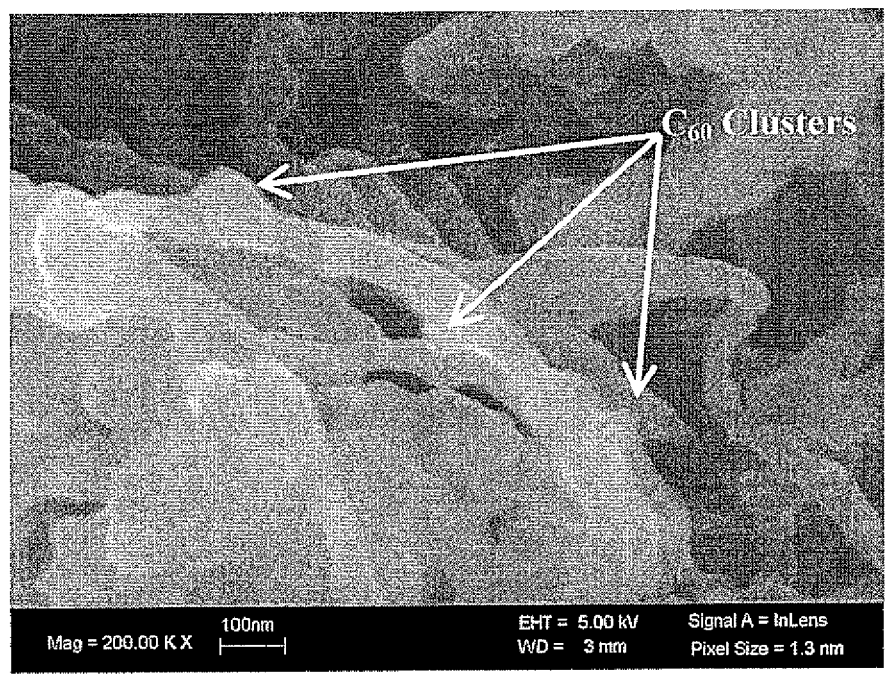
FIG. 3 shows a scanning electron microscope image of an exemplary $C_{60}$-SWCNT complex.

FIGS. 2 and 3 illustrate original SWCNTs and the $C_{60}$-SWCNT complex after microwave treatment, respectively. As shown in FIG. 2, original SWCNTs have uniform cylindrical surfaces without any catalyst particles or amorphous carbon. As shown in FIG. 3, after microwave induced reaction with $C_{60}$, the surface of the SWCNTs is dotted with clusters of $C_{60}$. $C_{60}$ molecules and/or clusters react with SWCNTs to form a weakly bonded or self-assembled $C_{60}$-SWCNT complex. Similar bonding has been reported.

Figure 4:
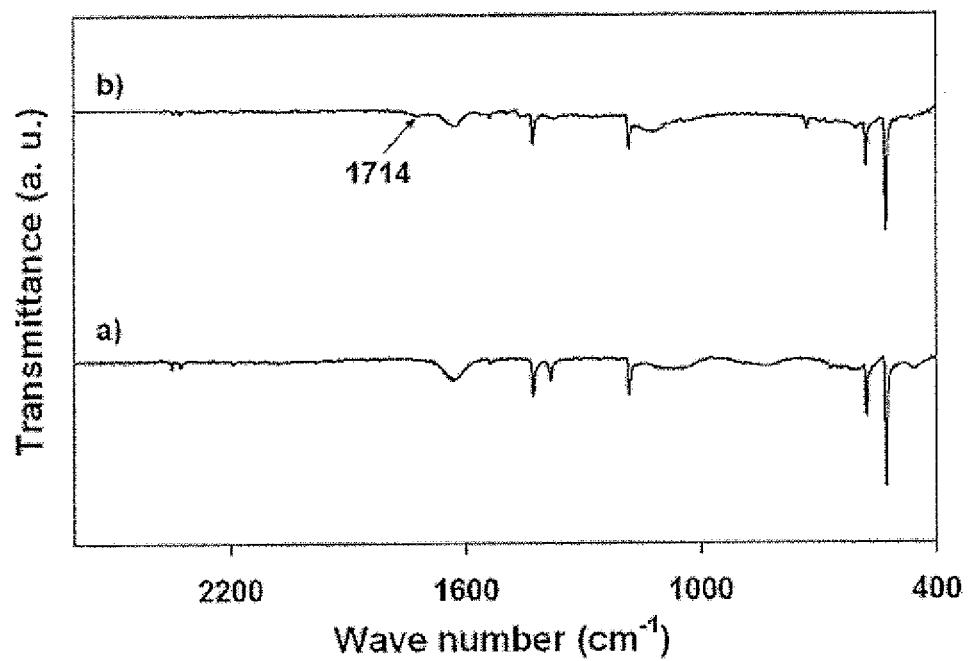
FIG. 4 shows Fourier transform infrared spectra of pristine $C_{60}$ (line a) and an exemplary $C_{60}$-SWCNT complex (line b)

Fourier transform infrared spectra of pristine $C_{60}$ (line a) and the $C_{60}$-SWCNT complex (line b) are shown in FIG. 4. While four characteristic IR active modes (525 $cm^{-1}$, 575 $cm^{-1}$, 1182 $cm^{-1}$, and 1428 $cm^{-1}$) for $C_{60}$ are present in the spectrum of the $C_{60}$-SWCNT complex, the weak absorption band at 1714 $cm^{-1}$, due to the —COOH functional group on the SWCNTs, provided evidence of the presence of SWCNTs in the complex.

An exemplary method for fabricating bulk heterojunction OPVs using a polymer:$C_{60}$-CNT composite will now be described. Photovoltaic cells can be fabricated on indium-tin-oxide (ITO) coated glass substrates. The glass substrates may be cleaned with detergent, rinsed with deionized water and ultrasonic cleaned in methanol. The glass substrates may then be dried with compressed nitrogen gas. A thin layer of poly (ethylenedioxy) thiophene:poly(styrene)sulfonate (PEDOT:PSS) can then be spin coated on the cleaned glass substrate and dried in an oven under atmospheric conditions. At this point, the samples may be transferred into a nitrogen filled glove box. The exemplary P3HT:$C_{60}$-SWCNT composite solution can then be spin coated on top of the PEDOT:PSS buffer layer to obtain a thin film. An aluminium cathode layer can then be deposited by thermal evaporation. Finally, the cells may be thermally annealed under a nitrogen atmosphere on a hot plate for a short period of time.

The following specific but non-limiting example of an implementation of the disclosed method for fabricating bulk heterojunction OPV cells using P3HT:$C_{60}$-SWCNT composite is presented for illustration thereof. Photovoltaic cells were fabricated on 25 mm×25 mm ITO coated glass substrates. The glass substrates with patterned ITO were cleaned with detergent, rinsed with deionized water and ultrasonic cleaned in methanol. The substrates were then dried with compressed nitrogen gas. A thin layer (~100 nm) of PEDOT:PSS was spin coated on the cleaned glass substrate from its aqueous dispersion and dried at 110° C. for 15 minutes in an oven under atmospheric conditions. The samples were then transferred into a nitrogen filled glove box. The composite solution was spin coated on top of the PEDOT:PSS buffer layer at 550 rpm for 15 seconds and then at 900 rpm for 20 seconds to obtain a film thickness of ca. 75-80 nm. An aluminium cathode layer 100 nm thick was deposited by thermal evaporation using a shadow mask at vacuum better than $2 \times 10^{-6}$ torr. The active cell area, defined by the intersection of the ITO and aluminium electrodes, was 0.18 $cm^2$. Film thickness and morphology of the active layers were measured with tapping-mode atomic force microscopy. The fabricated samples were annealed under a nitrogen atmosphere on a hot plate at 120° C. or 135° C. for 10 minutes.

Figure 5:
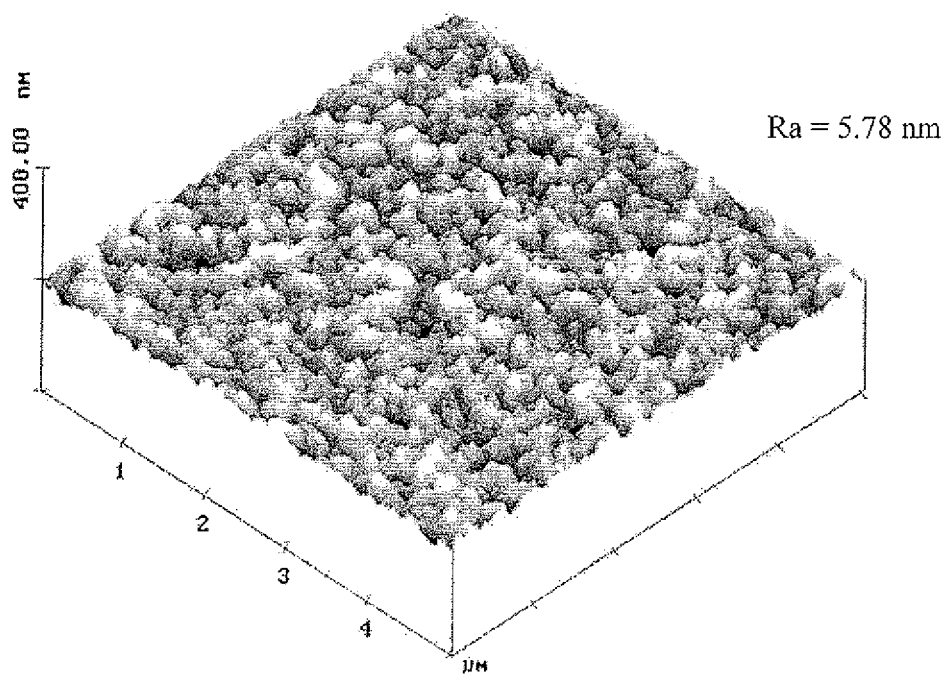
FIG. 5 is an atomic force microscope image showing a 5 μm×5 μm surface area scan of an exemplary P3HT:$C_{60}$ film.
Figure 6:
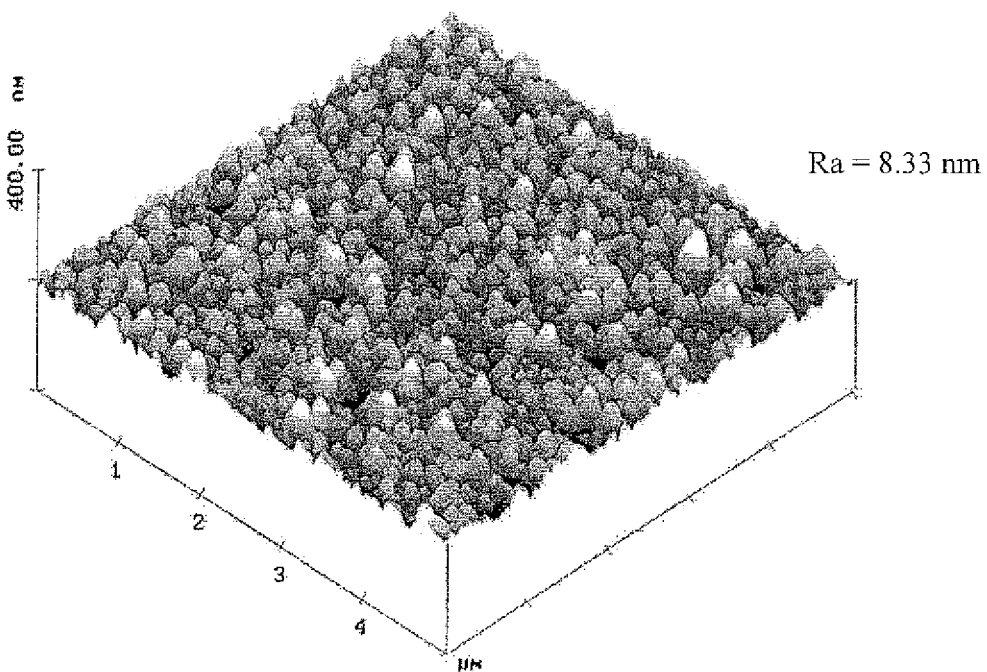
FIG. 6 is an atomic force microscope image showing a 5 μm×5 μm surface area scan of an exemplary P3HT:$C_{60}$-SWCNT film.

The morphology of a P3HT:$C_{60}$-SWCNT film is different from a P3HT:$C_{60}$ film. The surface of a P3HT:$C_{60}$-SWCNT film is significantly rougher than the P3HT:$C_{60}$ film. To illustrate this point, FIGS. 5 and 6 show AFM topographical images of films spin coated from P3HT polymer composites with pristine $C_{60}$ and with the $C_{60}$-SWCNT complex, respectively. The exemplar films in FIGS. 5 and 6 depict a roughness of Ra=8.33 nm for a P3HT polymer composite with pristine $C_{60}$ and a roughness of Ra=5.78 nm for a P3HT polymer composite with the $C_{60}$-SWCNT complex.

Figure 7:
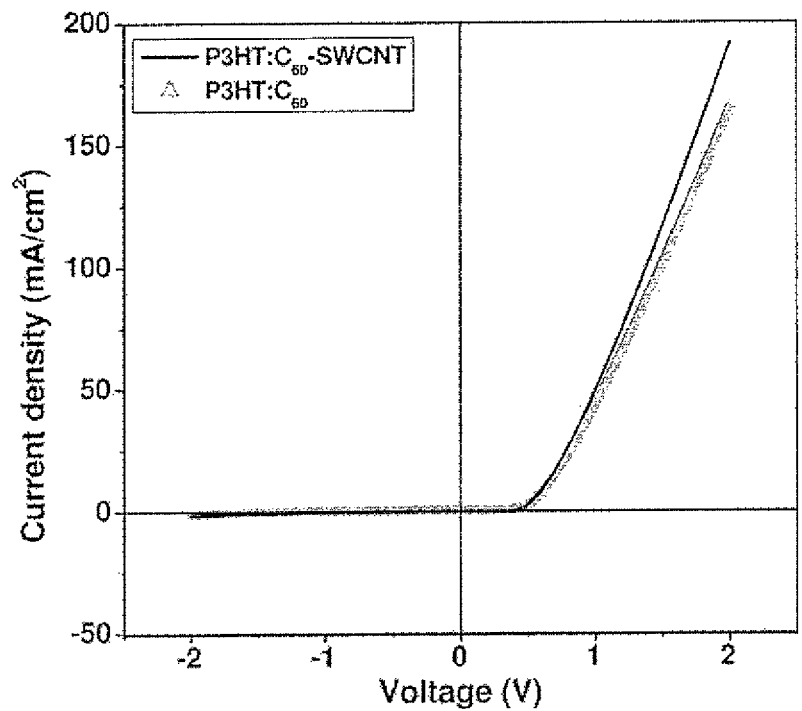
FIG. 7 shows Current-Voltage characteristics in the dark for exemplary photovoltaic cells (annealed at 120° C. for 10 minutes) comprising P3HT:$C_{60}$-SWCNT and P3HT:$C_{60}$ composites as the active layer.

FIG. 7 shows current-voltage (I-V) characteristics in the dark for cells with the $C_{60}$-SWCNT complex and pristine $C_{60}$. These cells were annealed at 120° C. for 10 min after aluminium deposition. Both devices showed typical diode behavior in the dark. Similar reverse leakage currents in these devices indicate that shorts or leakage of photocurrent through SWCNTs, if any, were negligible. The series resistance, $R_{SA}$, of the P3HT:$C_{60}$ cell was calculated to be 7.7 $\Omega cm^2$. Introduction of SWCNTs into the composite improved the electrical conductivity of the active layer, as demonstrated by the enhanced forward current under the same applied voltage (+2 V), and reduced the $R_{SA}$ to 6.5 $\Omega cm^2$.

Figure 8:
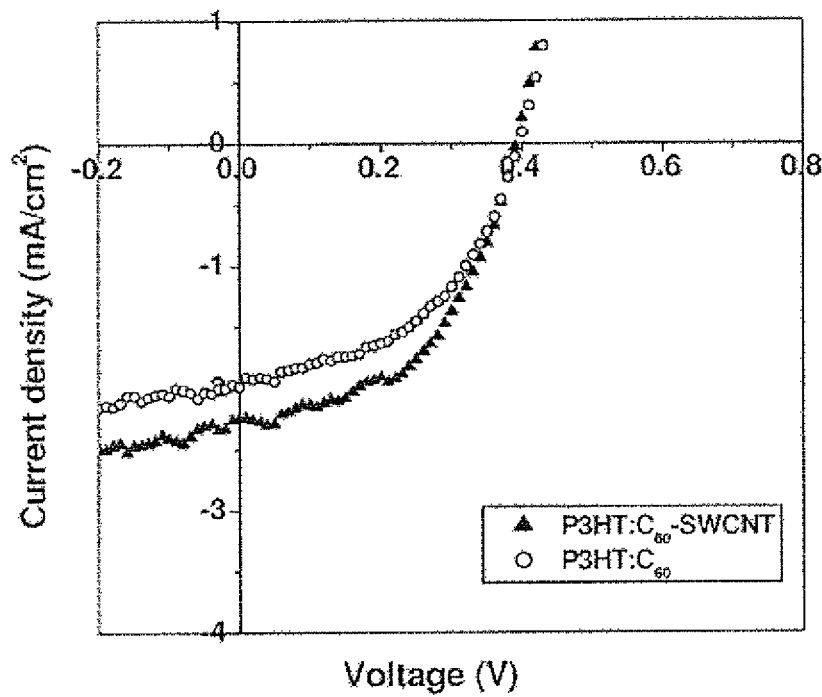
FIG. 8 shows Current-Voltage characteristics under simulated solar irradiation at 95 mW cm$^2$ for exemplary photovoltaic cells (annealed at 135° C. for 10 minutes) comprising P3HT:$C_{60}$-SWCNT and P3HT:$C_{60}$ composites as the active layer.
Figure 9:
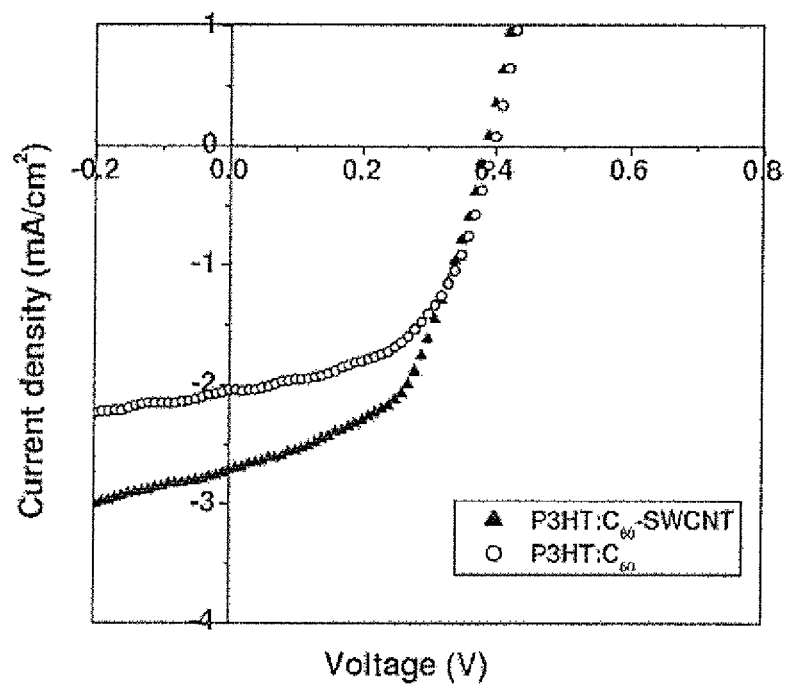
FIG. 9 shows Current-Voltage characteristics under simulated solar irradiation at 95 mW cm$^{-2}$ for exemplary photovoltaic cells (annealed at 120° C. for 10 minutes) comprising P3HT:$C_{60}$-SWCNT and P3HT:$C_{60}$ composites as the active layer.

Fill factor (FF) and power conversion efficiency ($\eta$) were calculated using the following equations:

$$FF = \frac{V_m I_m}{V_{OC} I_{SC}}$$

$$\eta = \frac{FF V_{OC} I_{SC}}{P_{IN}}$$

where $V_{OC}$ and $I_{SC}$ are the open circuit voltage and short circuit current, respectively, $V_m$ and $I_m$ are the voltage and current at the maximum output power point, respectively, and $P_{IN}$ is the incident light power. I-V characteristics under AM 1.5 G simulated solar irradiation at 95 mW $cm^{-2}$ for cells annealed at 135° C. and at 120° C. for 10 minutes are shown in FIGS. 8 and 9, respectively. Table 1 lists all photovoltaic parameters ($V_{OC}$, $I_{SC}$, FF, and $\eta$) for these cells.

TABLE 1

| Composite | Annealing temp./° C. | $V_{OC}$/mV | $J_{SC}$/mA $cm^{-2}$ | FF | $\eta$ (%) |
|---|---|---|---|---|---|
| P3HT:$C_{60}$-SWCNT | 120 | 386 | 2.72 | 0.512 | 0.57 |
| P3HT:$C_{60}$ | 120 | 397 | 2.05 | 0.488 | 0.42 |
| P3HT:$C_{60}$-SWCNT | 135 | 391 | 2.25 | 0.503 | 0.47 |
| P3HT:$C_{60}$ | 135 | 396 | 1.98 | 0.462 | 0.38 |

In general, cells annealed at 120° C. showed better performance than cells annealed at 135° C., in line with what has been reported about standard P3HT:PCBM bulk heterojunction photovoltaic cells. Excessive annealing at a higher temperature leads to a decrease in efficiency. Lower efficiency is most likely a result of excessive phase segregation, thus reducing the number of exciton dissociation sites.

In a single layered organic photovoltaic cell in which the active layer is composed of a pure conjugated polymer, the open circuit voltage $V_{OC}$ is principally determined by the work function difference between the two metal electrodes. The difference between the work function of the ITO electrode (Ø=4.8 eV) and that of the aluminium cathode (Ø=4.3 eV) is 0.4 eV, which matches closely the open circuit voltages measured on the disclosed cells with ITO/composite/aluminum structures.

Brabec et al. and Gadisa et al. found that in solar cells based on a polymer-PCBM composite, $V_{OC}$ is influenced by the lowest unoccupied molecular orbital (LUMO) level of PCBM and the highest occupied molecular orbital (HOMO) level of the conjugated polymer. Such a dependence of $V_{OC}$ on the D-A energy levels, however, was not observed in exemplary P3HT:$C_{60}$-SWCNT based cells. When SWCNTs were introduced into the photoactive composite layer via binding with $C_{60}$, the short circuit current density $J_{SC}$ increased (from 2.05 mA cm$^{-2}$ to 2.72 mA cm$^{-2}$ for cells annealed at 120° C., and from 1.98 mA cm$^{-2}$ to 2.25 mA cm$^{-2}$ for cells annealed at 135° C.) and the fill factor improved. Without wishing to be bound by a particular theory, enhancement in $J_{SC}$ was most likely due to more efficient electron transport because of the presence of SWCNTs. In photovoltaic cells that do now include CNTs, after charge separation at the polymer/$C_{60}$ interface, electrons can move towards the cathode only by hopping between $C_{60}$ molecules. It is believed that in $C_{60}$ based OPVs not containing CNTs, charge collection efficiency is limited as a result of charge recombination during the "hopping" process.

In contrast, CNTs can form a network throughout the composite layer and provide a direct path for enhanced electron transport. As illustrated in FIG. 1, electrons captured by $C_{60}$ molecules or clusters can be transferred to CNTs, which is energetically favored. Electron transfer from $C_{60}$ to CNTs is followed by electron transport that is faster than would be achieved by hopping among $C_{60}$ molecules. Also, any electrons captured by $C_{60}$ molecules not associated with any CNTs or CNT bundles can hop onto a $C_{60}$-CNT complex and be efficiently moved by the CNTs.

Figure 10:
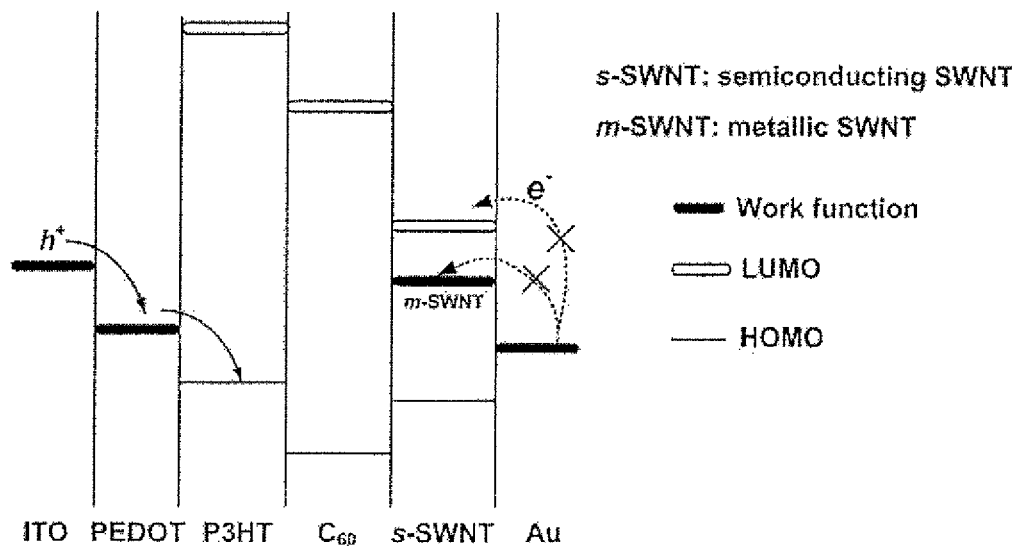
FIG. 10 shows an energy level diagram of a hole-only device in which the high work function of gold effectively prevents electron injection from the cathode into the active layer under forward bias.

The fill factor of polymer photovoltaic devices is closely related to the morphology of photoactive films. As demonstrated by the atomic force microscope images and roughness values in FIGS. 5 and 6, the surface of a P3HT:$C_{60}$-SWCNT film was rougher (Ra=8.33 nm) than a film without SWCNTs (Ra=5.78). A rougher surface may in effect increase the contact area between the active film and the cathode layer deposited on top of it, leading to a better fill factor. In order to confirm that the enhancement in short circuit current was primarily due to improved electron transport by the introduction of SWCNTs into the composite, hole-only devices with an ITO/PEDOT:PSS/composite/gold composite were fabricated. An energy level diagram of such a device is shown in FIG. 10.

Figure 11:
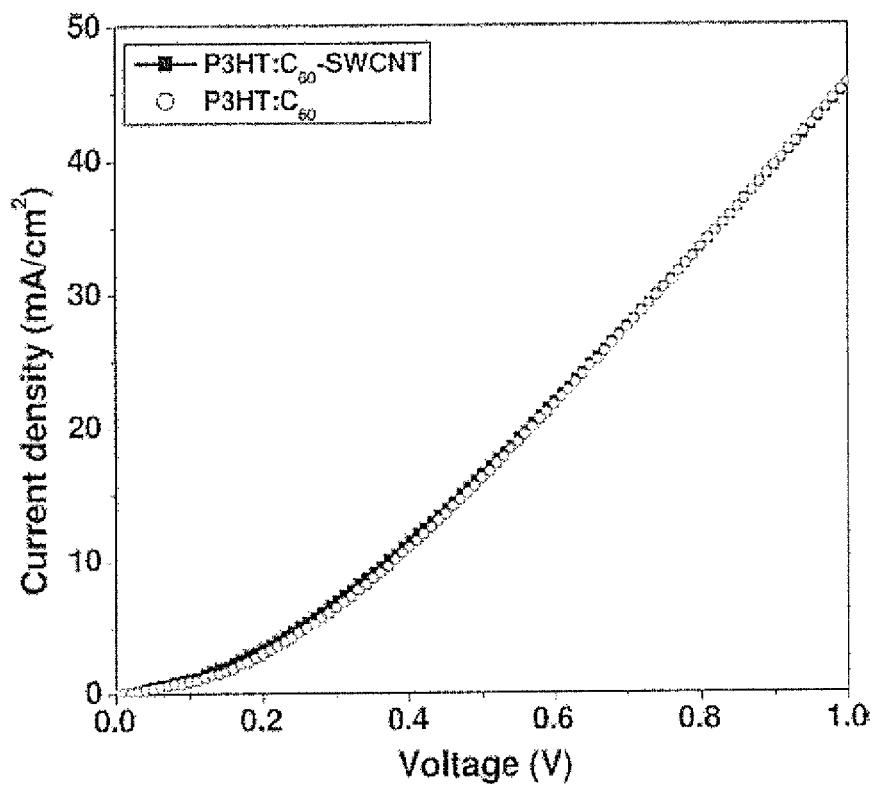
FIG. 11 shows Current-Voltage characteristics in the dark of hole-only devices with a gold cathode and shows incorporation of SWCNTs had no apparent effect on hole transport in the active layers.

As compared to the aluminium cathode, the higher work function of the gold cathode effectively prevented electron injection from the cathode into the active layer, and only holes can be injected from the anode and reach the cathode under forward bias conditions. The I-V characteristics of these devices in the dark, as shown in FIG. 11, indicates that incorporation of SWCNTs had no effect on hole transport property in the photoactive films. Based on these results, it is apparent that enhancement in photocurrent in the exemplary ITO/PEDOT:PSS/P3HT:$C_{60}$-SWCNT/aluminium cells was in fact due to improved electron transport.

It should be appreciated that embodiments of the present disclosure have not shown degradation due to the presence of moisture and/or oxygen. Although an aqueous solution of SWCNTs was used to introduce the nanotubes into the composites, no adverse effects on cell performance have been observed. It is believed that most of the water is removed during spin coating and any residual water molecules are evaporated during storage under vacuum before deposition of the aluminium layer.

It should also be appreciated that OPV devices using a P3HT:$C_{60}$-SWCNT composite in which SWCNT was present in the form of its ethanol solution were also tested. These cells showed lower efficiency (<0.04%) under similar testing conditions compared to cells which used SWCNTs in the form of its aqueous solution. It was observed that adding ethanol to toluene not only reduces the solubility of SWCNTs in the mixture, but also decreases the solubility of $C_{60}$ in the solvent. The effective weight percentage of $C_{60}$ and SWCNTs in the composite with P3HT polymer was much lower than that in the composite using water-soluble SWCNTs. It is believed that a reduced number of $C_{60}$ molecules and/or SWCNTs would reduce both the number of exciton dissociation sites and electron mobility in the film. As a result, the efficiency was much lower even than for the P3HT:$C_{60}$ cells.

The efficiencies of the disclosed P3HT:$C_{60}$-SWCNT photovoltaic cells are relatively low compared to the widely studied P3HT:PCBM cells. It is believed lower efficiency is attributable, in part, to the lower weight percentage (~30 wt %) of $C_{60}$ in the photoactive layer compared to the PCBM cells (typically 50 wt % or more), resulting in a lower number of exciton dissociation sites. The available number of active $C_{60}$ in the composite is limited because of the low solubility of the $C_{60}$-SWCNT complex. However, the present disclosure provides methods of efficiency enhancement of P3HT:$C_{60}$-SWCNT based photovoltaics via solvent vapor and thermal annealing.

An exemplary method for efficiency enhancement of polymer:$C_{60}$-CNT based photovoltaic cells according to the present disclosure involves solvent vapor annealing after spin coating of polymer:$C_{60}$-CNT and thermal annealing after the aluminium cathode layer is deposited. Solvent vapor and thermal annealing parameters must be chosen to effectuate optimized cell performance through enhanced optical absorption and phase separation.

In general, efficiency of OPVs can be improved by increasing light absorption and by more efficient charge separation and transport. The morphology and the order of the photoactive layer impact these factors significantly and can be modified by several means. For example, post-production thermal treatment has been shown to improve efficiency due to controlled phase separation, crystallization of the polymer and suitable rearrangement of its chain structure. Increased hole mobility and reduced series resistance can also be achieved by controlling the growth rate during solidification of the wet film, leading to appropriate self organization. Solvent vapor annealing which has been employed to improve regularity and order in thin films of block copolymers, has recently been shown to improve performance of P3HT:PCBM photovoltaic cells.

Optimizing film morphology plays an especially important role in the disclosed composite because the relatively large $C_{60}$-CNT (several hundred nanometers to micron scale) tends to from a composite with large heterogeneous structures. A high percentage of CNTs in a polymer matrix may short circuit the electrodes since the lengths of nanotubes are comparable to the film thickness. A low percentage of nanotubes may not effect cell performance. As a result, proper phase separation and rearrangement is critical for efficient absorption, charge separation, and charge collection in polymer:$C_{60}$-CNT composite based photovoltaics. The disclosed combination of solvent and thermal annealing is an optimum strategy to achieve high efficiency with polymer:$C_{60}$-CNT OPVs due to enhanced optical absorption, phase separation and electron transport.

While solvent vapor annealing for a short time can induce absorption enhancement in the blue-green region, increasing the annealing time can result in even higher absorption over the entire visible range. Thermal annealing can also result in increased optical absorption and cause a red shift of the absorption peak with a better match to the solar spectrum. However, a greater increase in optical absorption of a polymer:$C_{60}$-CNT based photovoltaic can be achieved by solvent vapor treatment followed by thermal annealing as compared to performing only one of the techniques.

In polymer:$C_{60}$-CNT based photovoltaics, the highly ordered structure in the polymer is disrupted when it is blended with the $C_{60}$-CNT complex. Disruption occurs particularly in polymer:$C_{60}$-CNT based photovoltaics because of the relatively large dimensions of the nanotubes. Solvent vapor treatment of the disclosed optimization process is able to penetrate into the film during the annealing process and induce structural rearrangement. After a short period of vapor annealing, phase separation between the polymer and $C_{60}$-CNT can occur. Extended exposure to solvent vapor, however, results in considerable distortion in film morphology and non-uniform phase separation. The thermal annealing treatment in the disclosed method can smooth a polymer:$C_{60}$-CNT based photovoltaics surface as a result of recovery of ordering of the polymer.

Although increased vapor annealing time can monotonically increase optical absorption of a polymer:$C_{60}$-CNT active layer, slower charge transport and higher leakage current eventually leads to reduced cell efficiency. Residual solvent from long exposures may cause non-uniform phase separation between the polymer and $C_{60}$-CNT, disturbing the uniform distribution of the electric field at the heterojunctions, which in turn lowers the open-circuit voltage. In general for the polymer:$C_{60}$-CNT system, although solvent annealing improves absorption, solvent vapor annealing alone is not an effective method for increasing overall quantum efficiency.

Thermal annealing can improve polymer:$C_{60}$-CNT based OPV performance. However, excessive thermal annealing at high temperatures can result in decreased efficiency due to a reduction in the number of exciton dissociation sites. Greater enhancement in polymer:$C_{60}$-CNT based photovoltaics is achieved by thermally annealing previously solvent treated devices compared to thermal annealing non-treated devices. The increase in polymer:$C_{60}$-CNT OPV performance post solvent and vapor treatment results from overall improvement in $V_{OC}$, FF, and especially $J_{SC}$. The improvement in $J_{SC}$ after thermal annealing can be partially attributed to increased optical absorption. For polymer:$C_{60}$-CNT based OPVs, post vapor treatment thermal annealing enhances optical absorption and causes a red shift of the absorption peak. Morphological change of the active layer also plays a significant role. Since thermal annealing is a high energy process, it can facilitate polymer self-organization and phase separation and has a greater effect on polymer:$C_{60}$-CNT OPVs pretreated with solvent vapor for longer times.

Thermal annealing at temperatures higher than the boiling point of the solvent used during solvent vapor annealing removes any residual solvent. Removal of the residual solvent reduces the number of void defects preventing charge recombination and prompts more efficient charge transport, which in turn allows for better polymer reorganization. A smoother surface on thermally annealed films also provides a better contact between the active layer and the cathode for more efficient electron collection. Based on these observations, it is evident that an optimum combination of solvent and thermal annealing is an effective method for enhancing quantum efficiency of polymer:$C_{60}$-CNT based photovoltaics.

The following specific but non-limiting example of an exemplary method for enhancing the efficiency of polymer:$C_{60}$-CNT based photovoltaics, via solvent vapor and thermal annealing, is presented for illustration of the present disclosure. The photoactive polymer composites were prepared as follows: a $C_{60}$-SWCNT complex was prepared as previously described. P3HT was then blended with the $C_{60}$-SWCNT complex at 1:1 weight ratio in a mixture of toluene and dichlorobenzene.

OPVs were fabricated on 25 mm×25 mm ITO coated glass substrates (Rs=8~12Ω/□ sheet resistance). The substrates with patterned ITO were cleaned with detergent, rinsed with DI water and ultrasonic cleaned in methanol. The substrates were then dried with compressed nitrogen. A layer of poly (ethylenedioxy)-thiophene:poly(styrene)sulfonate (PEDOT:PSS) was spin coated from its aqueous dispersion onto the cleaned glass substrate to obtain a 80~85 nm layer. The samples were dried at 115° C. for 15 minutes in an oven under atmospheric conditions and then transferred to a nitrogen-filled glove box. The exemplary P3HT:$C_{60}$-SWCNT composite solution was then spin coated on top of the PEDOT:PSS buffer layer at 500 rpm for 15 seconds and then at 850 rpm for 20 seconds to obtain a film thickness of ca. 80 nm.

Figure 12:
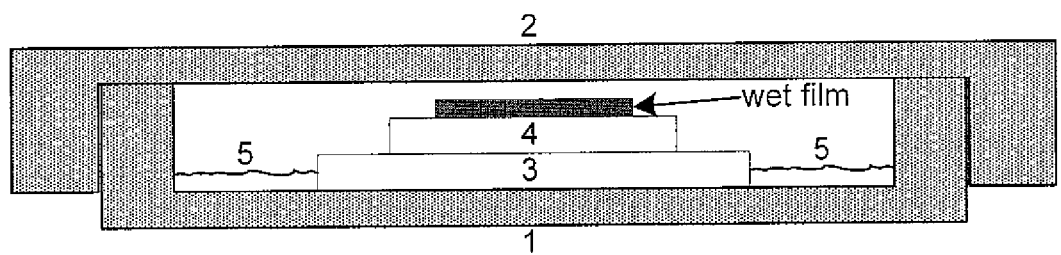
FIG. 12 illustrates an exemplary experimental set-up for solvent vapor annealing.

The freshly coated films were either dried in air or subjected to solvent annealing for various times (1, 5, and 20 minutes). FIG. 12 illustrates the set up for solvent annealing. ACS grade toluene 5 was added into a Petri-dish 1. Immediately after spin coating the sample 4 was placed on the supporting glass 3 and the dish cover 2 was sealed by using a weight. After a predetermined time, the sample was taken out and exposed to air until it was fully dry. All the samples were stored under vacuum overnight for removing residual solvents. Au aluminum cathode layer was deposited by thermal evaporation using a shadow mask at a vacuum level better than $2 \times 10^{-6}$ torr. The active cell area, defined by the intersection of ITO and aluminum electrodes, was approximately 0.16 cm$^2$.

Current-Voltage (I-v) characteristics in dark were measured in the glove box under nitrogen atmosphere, and the I-V characteristics under irradiation were measured in air. A source-measuring unit was used to generate the sweeping voltage and to record the current flowing through the device under test. A solar simulator with an AM 1.5 G filter was used to provide simulated solar irradiation at 95 mW cm$^{-2}$ irradiation intensity. This was checked with a calibrated thermopile detector before each measurement. After initial measurement, the cells were transferred to the glove box and thermally annealed under a nitrogen atmosphere on a hot plate at 120° C. for 10 min. The I-V characteristics in dark and under irradiation were measured under the same conditions.

Thin films were prepared by similar manner and characterized by UV-Vis absorption spectroscopy and atomic force microscopy (AFM). The films were formed by spin coating the exemplary P3HT:$C_{60}$-SWCNT solution onto cleaned glass slides. The freshly coated films were subjected to solvent annealing for various times (0, 1, 5, and 20 minutes) before fully dried in air. UV-Vis absorption spectra and surface morphology of the films were measured before and after thermal annealing (120° C. for 10 minutes) using a UV-Vis absorption spectrophotometer and a AFM scanning probe microscope, respectively.

Figure 13:
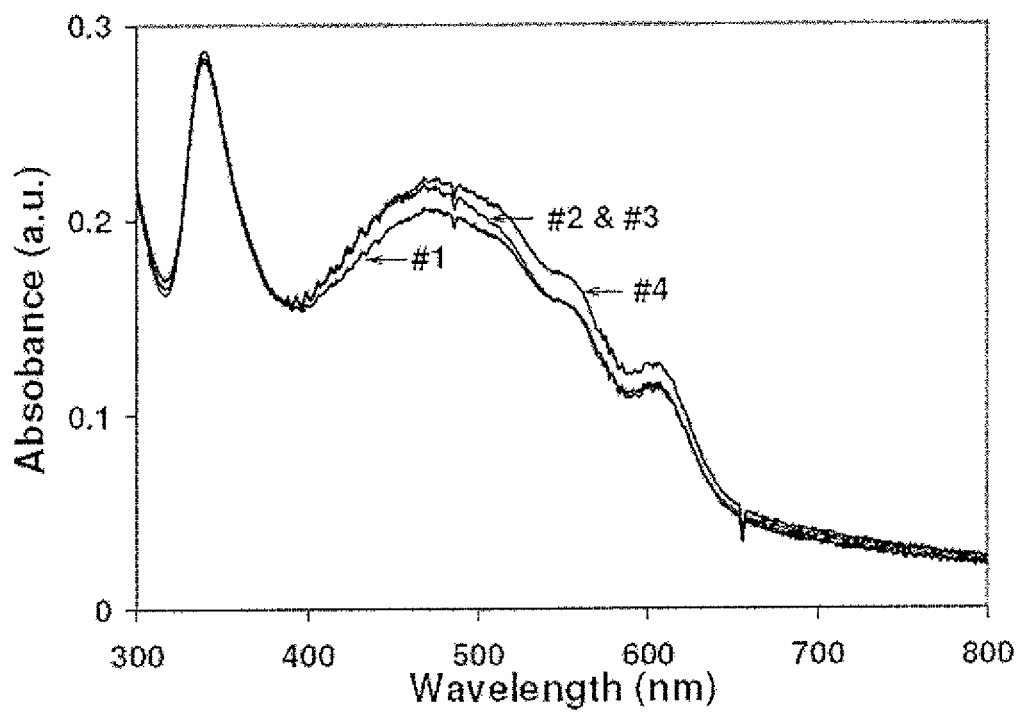
FIG. 13 shows UV-Vis absorption spectra of exemplary P3HT:$C_{60}$-SWCNT composite films without solvent vapor annealing (#1) and with solvent vapor annealing for 1 (#2), 5 (#3), and 20 (#4) minutes.

FIG. 13 depicts UV-Vis absorption spectra of spin-coated P3HT:$C_{60}$-SWCNT films measured after solvent annealing with toluene vapor for different lengths of times. The integrated visible absorption was defined as the area under the spectra in the range of 380 to 780 nm. As compared to the as-deposited film (#1), solvent vapor treated films showed increased absorption without any shift of the absorption peak (~468 nm). In contrast, solvent vapor treated P3HT:PCBM films have shown a red shift. The absorption associated with fullerene (indicated by absorption peaks at ca. 340 nm) in the P3HT:$C_{60}$-SWCNT films remained unchanged, suggesting that the increased optical absorption originated solely from polymer structural changes induced by solvent annealing. The integrated visible absorption of the P3HT:$C_{60}$-SWCNT films increased by 2.5, 3.4, and 8.1% after solvent annealing for 1 (#2), 5 (#3), and 20 (#4) minutes, respectively. Wile solvent annealing for 1 and 5 minutes (#2 and #3, respectively) induced absorption enhancement in the blue-green region (400~530 nm), increasing the annealing time to 20 minutes (#4) resulted in higher absorption over the entire visible range.

Figure 14:
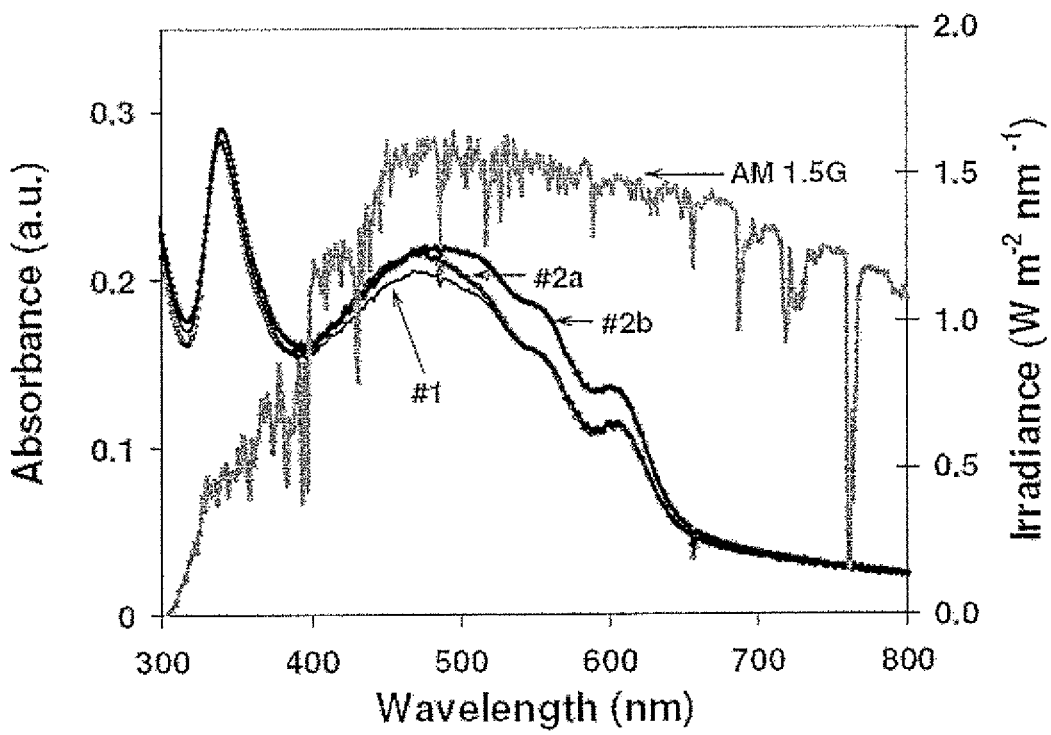
FIG. 14 shows UV-Vis absorption spectra of exemplary P3HT:$C_{60}$-SWCNT film after 1 minute of solvent annealing (#2a) followed by subsequent thermal annealing (#2b). Also shown in the figure are the absorption spectrum of the as-deposited film (#1) and the AM 1.5 G solar irradiance spectrum (AM 1.5 G)

FIG. 14 shows UV-Vis absorption spectra of film #2 after subsequent thermal treatment. Also shown in FIG. 14 are the spectrum for film #1, and the AM 1.5G solar spectrum. Thermal annealing resulted in increased optical absorption and a red shift of the absorption peak (from 468 nm to 484 nm) with a better match to the solar spectrum. Increased absorption and a red shift of the absorption peak indicate a more ordered polymer structure than before thermal treatment. Similar changes were observed on other thermally annealed films (consistent with what has been reported) as shown in Table 2.

Higher absorption was achieved by vapor treated films that were subsequently annealed thermally. The values of integrated absorption increased by an additional 6.2, 7.5, 9.4, and 6.3% for films #1, #2, #3 and #4, respectively. As compared to the untreated film A, films that had undergone both forms of annealing showed an increase in optical absorption, as high as 14.4%.

Figure 15:
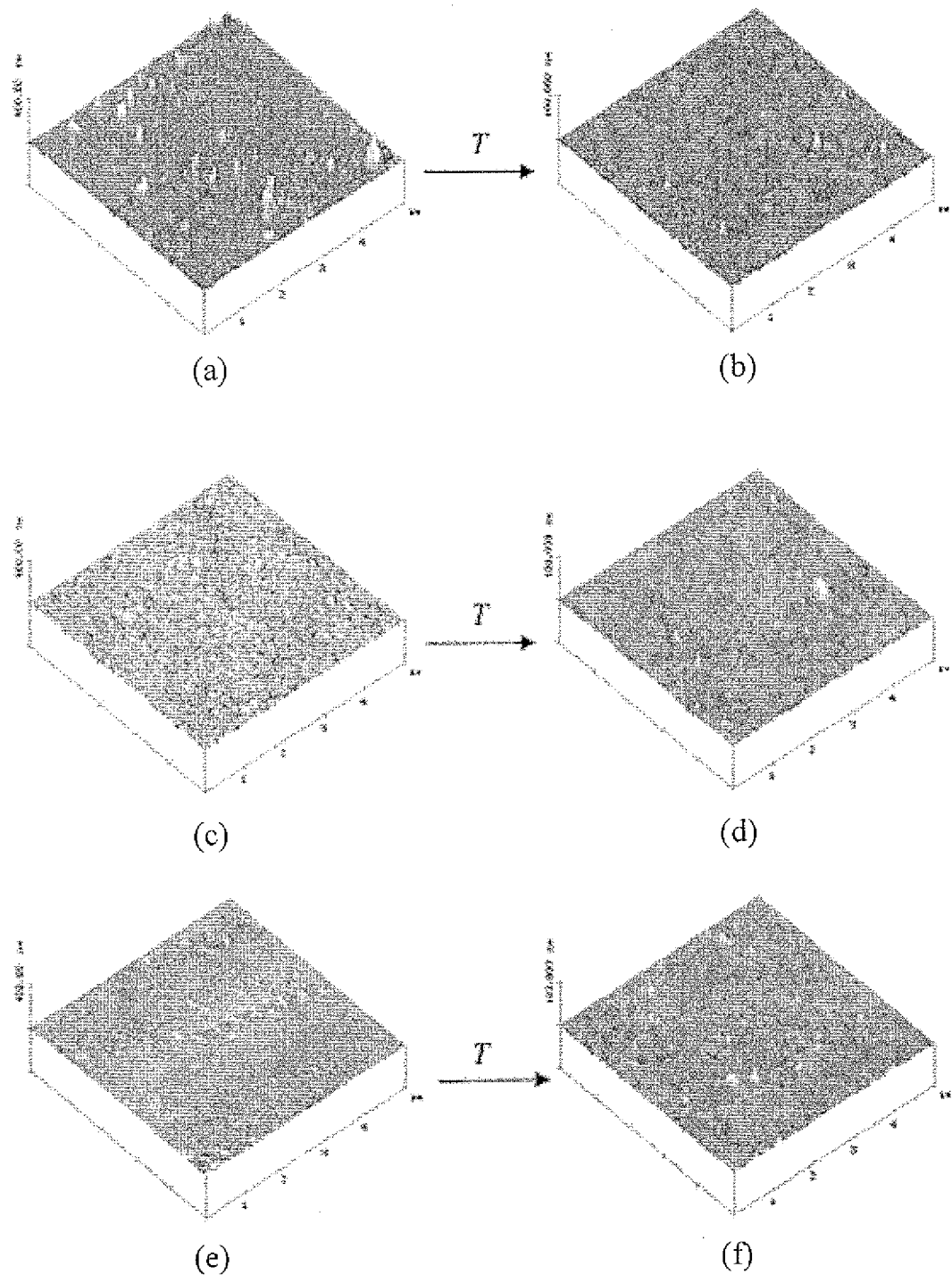
FIG. 15 shows atomic force microscope height images of exemplary P3HT:$C_{60}$-SWCNT composite films: (a) film # 1 (no solvent annealing) before thermal annealing, (b) film # 1 after thermal annealing, (c) film # 2 (1 minute solvent annealed) before thermal annealing, (d) film # 2 after thermal annealing, (f) film # 4 (20 minute solvent annealed) before thermal annealing, and (d) film # 4 after thermal annealing. The data scale for images (a), (c) and (e) is 0-200 nm, whereas for (b), (d), and (f) it is 0-50 nm.

FIG. 15 shows AFM images of the films before and after thermal annealing. Film (a) had no solvent annealing, film (b) is film #1 after thermal annealing, film (c) is film #2 with 1 minute of solvent annealing, film (d) is film #2 after thermal annealing and film (e) is film #4 after 20 minutes of solvent annealing. It is important to note that the scale for images (a), (c), and (e) is 0-200 nm, whereas for (b), (d) and (f) the scale is 0-50 nm.

The highly ordered structure in P3HT polymer was disrupted when it was blended with the $C_{60}$-SWCNT complex in a solution, especially because of the relatively large dimension of the nanotubes. As seen from FIG. 15(*a*), the film was featureless with numerous spikes as high as ~100 nm. It is believed solvent vapor was able to penetrate into the film during the annealing process and induced structural rearrangement. After a short period of toluene vapor annealing, phase separation between P3HT and $C_{60}$-SWCNT was prominent, indicated by relatively uniform nanostructures with approximate domain size of around 20 nm seen in FIG. 15(*c*). Extended exposure to solvent vapor resulted in considerable distortion in film morphology and non-uniform phase separation as shown in FIG. 15(*e*). After thermal annealing, all three films became smoother with roughly the same average surface roughness Ra (~0.7 nm). For film #1, the formation of a uniform polymer phase was accompanied by reduced peak-to-valley height from ~100 nm to ~22 nm. The major change on film #2 was the growth of domains of uniform phase separation. The apparent morphology change on the 20 minute solvent annealed film (#4) indicates recovery of ordering of P3HT induced by thermal treatment.

Figure 16:
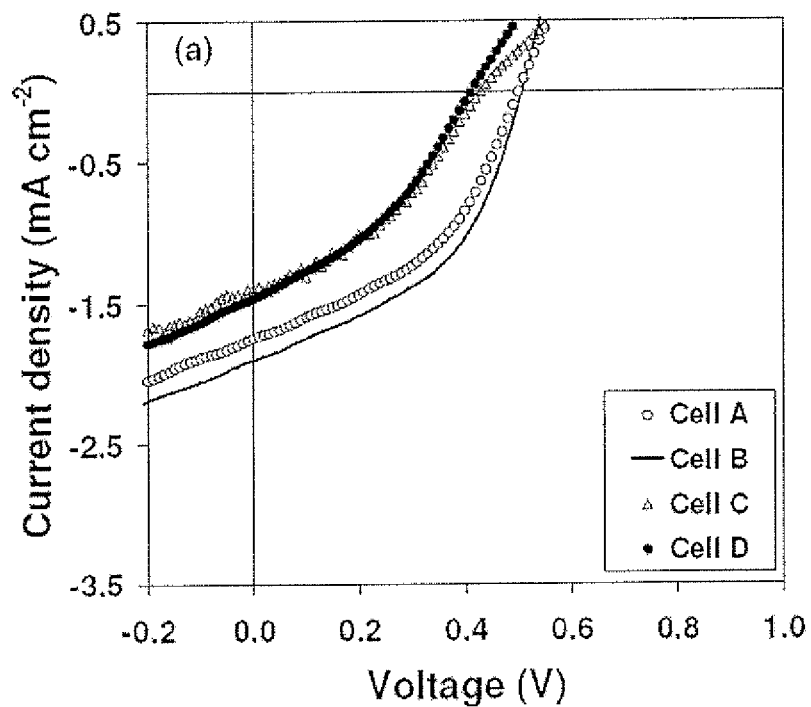
FIG. 16 shows Current-Density characteristics under simulated solar irradiation (95 mWcm$^{-2}$) measured after device fabrication, for exemplary P3HT:$C_{60}$-SWCNT based photovoltaics using as-deposited film (cell A), 1 minute solvent annealed film (cell B), 5 minute solvent annealed film (cell C) and 20 minute solvent annealed film (cell D).
Figure 17:
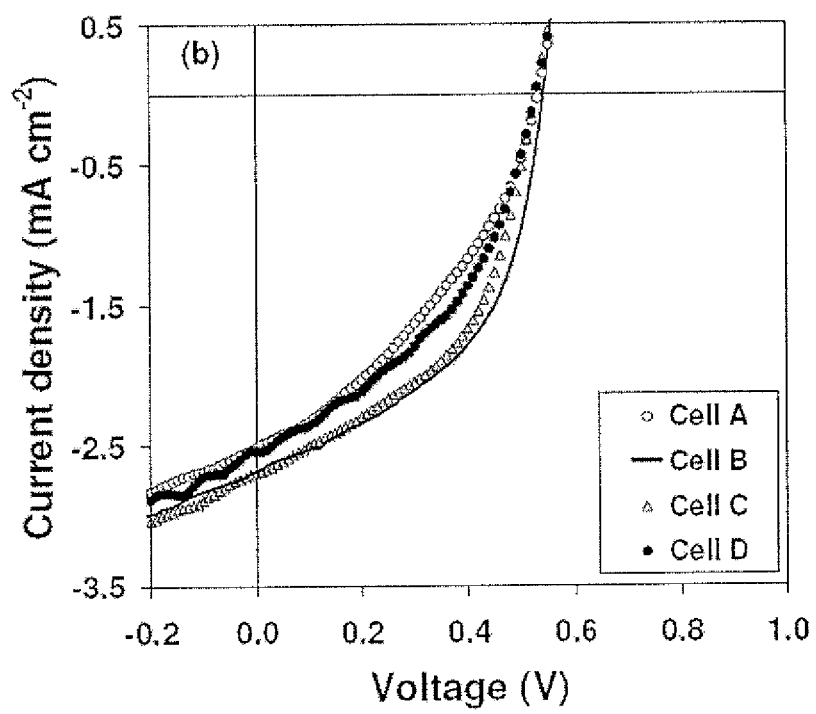
FIG. 17 shows Current-Density characteristics under simulated solar irradiation (95 mWcm$^{-2}$) measured after device fabrication and subsequent thermal annealing for exemplary P3HT:$C_{60}$-SWCNT based photovoltaic using as-deposited film (cell A), 1 minute solvent annealed film (cell B), 5 minute solvent annealed film (cell C) and 20 minute solvent annealed film (cell D).

The Current density vs. Voltage (J-V) curves under simulated solar irradiation (AM1.5G, 95 mW cm$^{-2}$) measured after the fabrication of OPVs with solvent annealing times of 0 (cell A), 1 (cell B), 5 (cell C), and 20 minutes (cell D). FIG. 16 shows the J-V curves of these cells after subsequent thermal annealing under the same test conditions. Performance of these cells is summarized in Table 3.

TABLE 3

| | As-fabricated | | | | Thermally annealed | | | |
|---|---|---|---|---|---|---|---|---|
| Cell # (solvent annealing time) | $V_{OC}$ (V) | $J_{SC}$ (mA cm$^{-2}$) | FF | η (%) | $V_{OC}$ (V) | $J_{SC}$ (mA cm$^{-2}$) | FF | η (%) |
| A (0 min.) | 0.500 | 1.75 | 43.3% | 0.40% | 0.532 | 2.52 | 37.1% | 0.52% |
| B (1 min.) | 0.506 | 1.90 | 45.5% | 0.46% | 0.541 | 2.69 | 49.2% | 0.75% |
| C (5 min.) | 0.429 | 1.40 | 38.4% | 0.24% | 0.527 | 2.70 | 47.4% | 0.71% |
| D (20 min.) | 0.412 | 1.46 | 36.9% | 0.23% | 0.527 | 2.54 | 42.5% | 0.60% |

TABLE 2

| Film # | $t_{SA}$ (min.) | Increase due to solvent annealing | Increase due to thermal annealing | Total increase |
|---|---|---|---|---|
| 1 | 0 | — | 6.2% | 6.2% |
| 2 | 1 | 2.5% | 7.5% | 10.0% |
| 3 | 5 | 3.4% | 9.4% | 12.8% |
| 4 | 20 | 8.1% | 6.3% | 14.4% |

As compared to the control cell A, exposure of the active layer to toluene vapor for 1 minute (cell B) resulted in a slight increase in the short-circuit current density ($J_{SC}$) from 1.75 to 1.90 mA cm$^{-2}$ and an increase in the fill factor (FF) from 43.3 to 45.5%. The open-circuit voltage ($V_{OC}$) remained unchanged. As a result, the power conversion efficiency (η) improved from 0.40 to 0.46%.

This improvement may be attributed to simultaneous increase in optical absorption (FIG. 13) and in hole transport efficiency due to a more ordered polymer structure (FIG. 15(*c*)). Solvent annealing for longer times (cells C and D) resulted in the decrease in all photovoltaic parameters ($V_{OC}$, $J_{SC}$, FF) and the net effect was reduced cell efficiencies, even lower than that of control cell A. Analysis of the J-V curves in dark revealed that the reverse leakage current measured at −2 V for cell C (2.86 mA cm$^{-2}$) and cell D (6.50 mA cm$^{-2}$) were much higher than those for cell A (0.77 mA cm$^{-2}$) and cell B (mA cm$^{-2}$). Higher leakage current resulted in lower collection efficiency which was indicated by the lower fill factors. Trapped solvent may led to slower charge transport and higher probability of electron-hole recombination.

Although increased vapor annealing time monotonically increased optical absorption of the active layer (FIG. 13), slower charge transport and higher leakage current eventually lead to reduced cell efficiency. Residual solvent from long exposures may have also caused non-uniform phase separation between P3HT and $C_{60}$-SWCNT disturbing the uniform distribution of the electric field at the heterojunctions, which in turn lowered the open-circuit voltage. In general for the P3HT:$C_{60}$-SWCNT system, although solvent annealing improved absorption by as much as 9.4%, it does not appear to be an effective method for increasing overall quantum efficiency for P3HT:$C_{60}$-SWCNT based photovoltaics.

Improvement in performance after thermal annealing was quite evident for all the cells. However, this enhancement was more prominent on cells with previous solvent treatment. For example, the efficiency of cell C nearly tripled and that of cell D was more than doubled, while the efficiency of cell A increased by only 30%. As can be seen from the data in Table 3, the dramatic performance enhancement after thermal annealing for solvent treated cells resulted from overall improvement in $V_{OC}$, FF, and especially Jsc. The highest $J_{SC}$ (2.70 mA cm$^{-2}$) and the largest percentage increase in $J_{SC}$ (92.6%) occurred for cell C. More importantly, under the same thermal annealing condition, all solvent annealed cells showed efficiencies higher than the control cell A. Notably, the efficiency of cell B was 87.5% higher than the as-fabricated cell A. This enhancement is rather dramatic and demonstrates the importance of the combination of solvent and thermal annealing. As mentioned before, this is particularly relevant to a P3HT:$C_{60}$-SWCNT based photovoltaics. For example, as compared to only thermal annealing, solvent and thermal annealing combination resulted in almost a 10% enhancement in efficiency for the P3HT:PCBM photovoltaic but 44% in the P3 HT:$C_{60}$-SWCNT based photovoltaic.

Improvement in $J_{SC}$ after thermal annealing can be partially attributed to increased optical absorption. For P3HT: PCBM based photovoltaics, it has been reported that subsequent thermal annealing had little effect on the absorption of slow-grown or vapor treated films. However, for the P3HT: $C_{60}$-SWCNT films, subsequent thermal annealing not only enhanced absorption but also caused a red shift of the absorption peak. For example, 5 minute solvent annealing resulted in a 3.4% increase in absorption while subsequent thermal annealing of the same film led to a total increase of 12.8%.

Morphological change of the active layer also played a significant role in enhancing P3HT:$C_{60}$-SWCNT based photovoltaics. In P3HT:PCBM OPVs, thermal annealing is known to order P3HT domains via inter-chain actions and molecular diffusion of the PCBM phase out of the polymer matrix. Since thermal annealing is a high energy process, it can facilitate polymer self-organization and phase separation. Thermal annealing had a more significant effect on P3HT: $C_{60}$-SWCNT based photovoltaics pretreated with solvent vapor for longer times (cells C and D). The reverse leakage current reduced to 0.26 mA cm$^{-2}$ after thermal annealing for both these cells, indicating a smaller number of defects in the active layer. Annealing at temperatures higher than the boiling point enhanced the removal of residual solvent. Removal of the solvent residue reduces the number of void defects preventing charge recombination. The reduction in defects prompts more efficient charge transport and allows for better polymer reorganization. A smoother surface on thermally annealed films (FIG. 15) also provided a better contact between the active layer and the cathode for more efficient electron collection. These factors contributed to the dramatic increases in Jsc and FF on cells C and D. Based on these observations, it is evident that an optimum combination of solvent and thermal annealing is an effective method for enhancing quantum efficiency of P3HT:$C_{60}$-SWCNT based photovoltaics.

Another exemplary method for efficiency enhancement of polymer:CNT based photovoltaic cells includes alignment of CNTs in an electrical field. Alignment of CNTs in a direction perpendicular to the device plane makes full use of the superior electron transport functionality of CNTs. By employing electrical-field assisted alignment of CNTs in an exemplary P3HT:$C_{60}$-SWCNT based OPV, the short-circuit current density (Jsc) and the fill factor (FF) were improved by 45.1% and 23% respectively, while the open-circuit voltage remained almost unchanged. As a result, the power conversion efficiency of the P3HT:$C_{60}$-SWCNT based photovoltaic cells was enhanced by as much as 58%.

Another exemplary method for efficiency enhancement of polymer:CNT based photovoltaic cells according to the present disclosure includes the introduction of at least one dye or titanium dioxide. Introduction of dye, dyes, titanium dioxide or combinations thereof are known to enhance light absorption, power conversion efficiency or both.

The present disclosure also provides for the introduction of CNTs in QD-polymer based photovoltaics. In an exemplary embodiment, quantum dots (QDs) are incorporated into the polymer of a polymer:$C_{60}$-CNT or polymer:CNT composite forming an organic/inorganic hybrid photovoltaic. The bandgap energy, and thus optical absorption, of QDs in a photovoltaic device can be tailored by altering their size distribution. In QD-polymer nanocomposites, absorption spectra of QDs and the polymer can be complementary to form broadband absorbing materials. These broad-band absorbing materials can effectively convert visible and near infrared solar irradiation more closely matching to the actual solar irradiation spectrum for more efficient exciton generation. The broad-band absorbing materials absorb low-energy photons that can not be absorbed by polymers. For example, P3HT can only absorb visible light in the 400 to 600 nm wavelength range. The use of QD-polymer nanocomposites can extend the absorption spectrum of a P3HT based photoactive composite beyond 600 nm and even into the near infrared region.

The tunable electron affinity and exceedingly large surface-to-volume ratios of QDs enhance charge transfer rates. Multiple lower energy carriers can be generated in a QD from absorption of a single photon with energy higher than the bandgap so that solar energy in the near-UV portion can also be utilized. As compared to organic dyes used in dye-sensitized solar cells, QDs do not photobleach and have strong temperature tolerance. Charge separation and extraction of charge carriers may occur in both directions at the QD-polymer interface because excitons can be generated on both the polymer and QDs. This charge transfer process requires good contact between the polymer and the QDs.

Inefficient transport of photogenerated charge carriers is the major source of efficiency loss in QD-polymer based photovoltaic devices. Similar to fullerenes, quantum dots rely on a hopping mechanism to transport the electrons. The inherent inefficiency of this process results from the introduction of losses even at a high doping level of quantum dots. To improve electron transport, CdSe quantum dots have been replaced with CdSe quantum rods with lengths up to 50 nm. However, electrons still must hop from one rod to another, and the high doping level of the quantum rods (90 wt %) may have adverse effects, such as the reduction in visible absorption.

Figure 18:
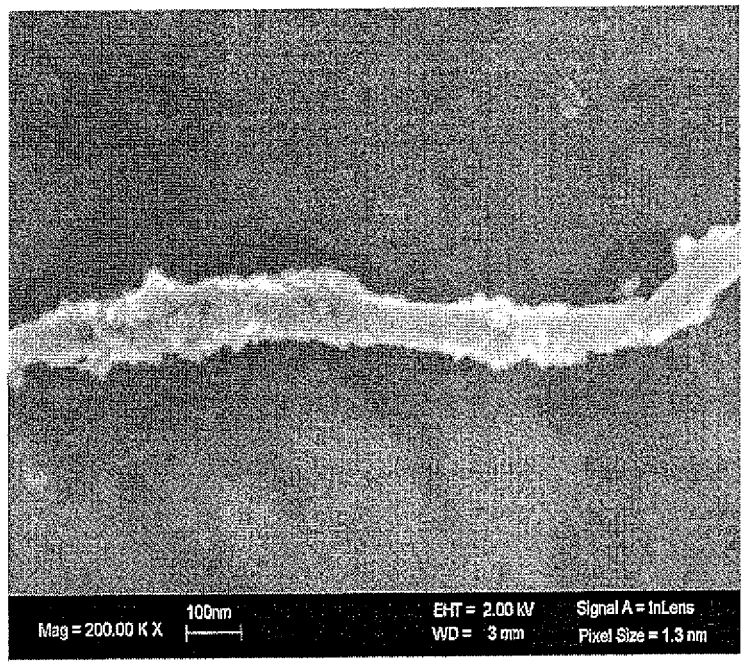
FIG. 18 shows scanning electron microscope images of exemplary multiwalled carbon nanotubes coated with (a) Cadmium Sulfide (CdS) and (b) Zinc Sulfide (ZnS).
Figure 18:
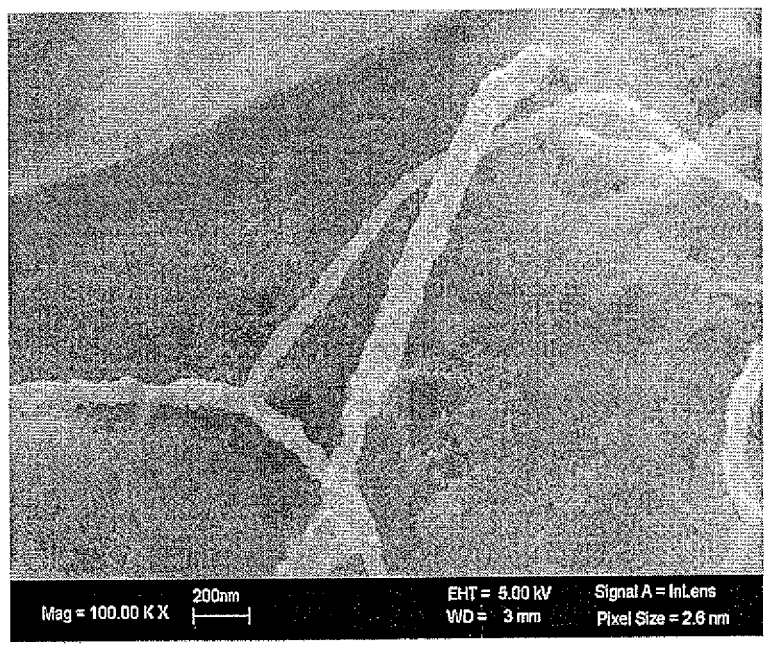

The present disclosure provides for the introduction of CNTs in QD-polymer based photovoltaics. The low percolation threshold and excellent electrical conductivity of CNTs can ensure efficient electron transport even at a very low doping level via mechanisms similar to FIG. 1. Exemplary nanotube-QD complexes are shown in FIG. 18. FIG. 18(a) shows Cadmium Sulfide (CdS) and FIG. 18(b) shows Zinc Sulfide (ZnS) deposited directly on multiwalled carbon nanotubes. The nanotube-QD complexes were created by an in-situ (without the use of any ligands) chemical synthesis so that the QDs would coat and/or decorate the SWCNT surface.

Although implementations of the invention have been described in detail above, those skilled in the art will readily appreciate that many modifications, variations and/or enhancements are possible without materially departing from the novel teachings and advantages of the present disclosure. Such modifications, variations and enhancements are intended to be included within the scope of the present disclosure as defined in the following claims.

What is claimed is:

1. An organic or organic/inorganic hybrid photovoltaic conversion device comprising:
    a composite film of a photoactive polymer, fullerene $C_{60}$ molecules, and soluble or dispersible microwave functionalized carbon nanotubes, each carbon nanotube having at least one functional group on each respective carbon nanotube, with a plurality of clusters of fullerene $C_{60}$ molecules of the composite film microwave bonded to and covering the outer surfaces of the carbon nanotubes of the composite film; and
    an electrode adapted to collect current;
    wherein the composite film has a surface roughness, Ra, of 8.33 nm;
    wherein upon light irradiation of the composite film, photo-induced charge separation at the polymer:fullerene $C_{60}$ interface of the composite film is followed by direct electron transfer from at least one microwave bonded fullerene $C_{60}$ molecule to at least one respectively bonded carbon nanotube to provide a direct path for electron transport towards the electrode;
    wherein the photoactive polymer, the fullerene $C_{60}$ molecules, carbon nanotubes and electrode are positioned in a photoactive layer, and the photoactive layer is formed on a substrate, with the substrate including a planarizing layer of PEDOT:PSS;
    wherein the photoactive layer defines a first plane;
    wherein the carbon nanotubes are oriented in a direction that is perpendicular relative to the first plane;
    wherein the photovoltaic conversion device has a short-circuit current density of 2.52 mA cm$^{-2}$ or higher, and wherein the photovoltaic conversion device has a fill factor of 37.1% or higher;
    wherein quantum dots are dispersed in the photoactive polymer; and
    wherein the absorption spectra of the quantum dots and the photoactive polymer are complementary.

2. The device of claim 1, wherein the photoactive polymer acts as an electron donor, at least one microwave bonded fullerene $C_{60}$ acts as an electron acceptor, and at least one bonded carbon nanotube acts as an electron transporter to the electrode.

3. The device of claim 1, wherein the fullerene $C_{60}$ molecules and carbon nanotubes form a weakly, covalently bonded complex or self-assembled complex.

4. The device of claim 1, wherein the photoactive polymer is P3HT.

5. The device of claim 1, wherein the fullerene $C_{60}$ molecules and the carbon nanotubes form a complex and wherein said complex and the photoactive polymer form the composite film.

6. The device of claim 5, wherein the composite film is structurally ordered in a controlled manner.

7. The device of claim 6, wherein the controlled manner comprises solvent vapor annealing followed by thermal annealing.

8. The device of claim 6, wherein the controlled manner comprises solvent vapor annealing, thermal annealing or both.

9. The device of claim 8, wherein solvent annealing is undertaken with a solvent selected from the group consisting of toluene, an alkene, an alkane, hexane, an alcohol, a chlorinated solvent, or an organic solvent.

10. The device of claim 8, wherein the solvent annealing is performed for 5 or less minutes.

11. The device of claim 8, wherein the thermal annealing is performed at 135° C. or less.

12. The device of claim 1, wherein the device comprises a solar cell.

13. The device of claim 1, wherein the substrate includes an indium-tin-oxide coated glass substrate.

14. The device of claim 1, wherein the device is characterized by an overall stiffness that is determined by the stiffness of the substrate.

15. The device of claim 1, wherein the carbon nanotubes are aligned in an electrical field.

16. A thermal and vapor solvent annealed organic or organic/inorganic hybrid photovoltaic conversion device, comprising:
    a composite film of a polymer, fullerene $C_{60}$ molecules, and microwave carboxylated or sulfonated carbon nanotubes, with a plurality of clusters of fullerene $C_{60}$ molecules of the composite film microwave bonded to and covering the outer surfaces of the carboxylated or sulfonated carbon nanotubes of the composite film; and
    an electrode adapted to collect current;
    wherein the composite film has a surface roughness, Ra, of 8.33 nm;
    wherein upon light irradiation of the composite film, photo-induced charge separation at the polymer:fullerene $C_{60}$ interface of the composite film is followed by direct electron transfer from at least one microwave bonded fullerene $C_{60}$ molecule to at least one respectively bonded carbon nanotube to provide a direct path for electron transport towards the electrode;
    wherein the polymer acts as an electron donator;
    wherein the at least one microwave bonded fullerene $C_{60}$ molecule acts as an electron acceptor;
    wherein the polymer, the fullerene $C_{60}$ molecules, carbon nanotubes and electrode are positioned in a photoactive layer, and the photoactive layer is formed on a substrate, with the substrate including a planarizing layer of PEDOT:PSS;
    wherein the photoactive layer defines a first plane;
    wherein the carbon nanotubes are oriented in a direction that is perpendicular relative to the first plane;
    wherein the photovoltaic conversion device has a short-circuit current density of 2.52 mA cm$^{-2}$ or higher, and wherein the photovoltaic conversion device has a fill factor of 37.1% or higher;
    wherein quantum dots are dispersed in the photoactive polymer; and
    wherein the absorption spectra of the quantum dots and the photoactive polymer are complementary; and
    wherein the substrate includes an indium-tin-oxide coated glass substrate.

17. The device of claim 16, wherein the carbon nanotubes are aligned in an electrical field.

* * * * *